(12) United States Patent
Smith et al.

(10) Patent No.: US 10,584,027 B2
(45) Date of Patent: Mar. 10, 2020

(54) METHOD FOR FORMING HERMETIC SEALS IN MEMS DEVICES

(71) Applicant: ELBIT SYSTEMS OF AMERICA, LLC, Fort Worth, FL (US)

(72) Inventors: Arlynn W. Smith, Blue Ridge, VA (US); Dan Chilcott, Buchanan, VA (US)

(73) Assignee: ELBIT SYSTEMS OF AMERICA, LLC, Fort Worth, TX (US)

( * ) Notice: Subject to any disclaimer, the term of this patent is extended or adjusted under 35 U.S.C. 154(b) by 88 days.

(21) Appl. No.: 15/829,314

(22) Filed: Dec. 1, 2017

(65) Prior Publication Data

US 2019/0169023 A1 Jun. 6, 2019

(51) Int. Cl.
*H01L 23/02* (2006.01)
*B81C 1/00* (2006.01)
(Continued)

(52) U.S. Cl.
CPC ............ *B81C 1/00269* (2013.01); *B32B 3/30* (2013.01); *B32B 7/12* (2013.01); *B32B 9/04* (2013.01); *B32B 17/06* (2013.01); *B32B 37/12* (2013.01); *B32B 37/18* (2013.01); *B81B 7/0041* (2013.01); *B81C 3/001* (2013.01); *C03C 27/046* (2013.01); *G02B 23/12* (2013.01); *B32B 2313/00* (2013.01); *B32B 2315/08* (2013.01); *B32B 2457/00* (2013.01); *B81B 2201/047* (2013.01); *B81B 2203/0315* (2013.01); *B81C 2201/013* (2013.01); *B81C 2201/019* (2013.01);
(Continued)

(58) Field of Classification Search
CPC .................... B32B 3/30; B32B 7/12

USPC ................ 438/118, 942, 951, 947
See application file for complete search history.

(56) References Cited

U.S. PATENT DOCUMENTS 5,197,653 A 3/1993 Beckwith et al.
5,723,945 A 3/1998 Schermerhorn
(Continued)

FOREIGN PATENT DOCUMENTS

WO 9903122 A1 1/1999

OTHER PUBLICATIONS

Ishida, H., and T. Ogashiwa, "Low-Temperature Hermetic Seal Bonding for Wafer-Level MEMS Packaging using Sub-Micron Gold Particles with Stencil Printing Patterning," SUSS Report (2015).

(Continued)

*Primary Examiner* — Nitin Parekh
(74) *Attorney, Agent, or Firm* — K&L Gates LLP

(57) ABSTRACT

A method of processing a double sided wafer of a micro-electromechanical device includes spinning a resist onto a first side of a first wafer. The method further includes forming pathways within the resist to expose portions of the first side of the first wafer. The method also includes etching one or more depressions in the first side of the first wafer through the pathways, where each of the depressions have a planar surface and edges. Furthermore, the method includes depositing one or more adhesion metals over the resist such that the one or more adhesion metals are deposited within the depressions, and then removing the resist from the first wafer. The method finally includes depositing indium onto the adhesion metals deposited within the depressions and bonding a second wafer to the first wafer by compressing the indium between the second wafer and the first wafer.

20 Claims, 6 Drawing Sheets

(51) Int. Cl.
*B81C 3/00* (2006.01)
*G02B 23/12* (2006.01)
*B32B 3/30* (2006.01)
*B32B 7/12* (2006.01)
*B32B 9/04* (2006.01)
*B32B 17/06* (2006.01)
*B32B 37/12* (2006.01)
*B32B 37/18* (2006.01)
*B81B 7/00* (2006.01)
*C03C 27/04* (2006.01)

(52) U.S. Cl.
CPC .. *B81C 2203/035* (2013.01); *B81C 2203/037* (2013.01); *B81C 2203/038* (2013.01)

(56) References Cited

U.S. PATENT DOCUMENTS

| | | | | |
|---|---|---|---|---|
| 5,940,694 | A * | 8/1999 | Bozada | H01L 21/7605 257/E21.452 |
| 6,605,519 | B2 * | 8/2003 | Lishan | H01L 21/28 257/E21.158 |
| 6,837,766 | B2 | 1/2005 | Costello | |
| 7,325,715 | B2 | 2/2008 | Costello | |
| 7,607,560 | B2 | 10/2009 | Costello | |
| 2004/0157407 | A1 * | 8/2004 | Tong | B23K 20/02 438/455 |
| 2005/0082480 | A1 | 4/2005 | Wagner et al. | |
| 2006/0208326 | A1 * | 9/2006 | Nasiri | B81C 1/00238 257/414 |
| 2009/0256251 | A1 * | 10/2009 | Getz | B81B 7/007 257/698 |
| 2012/0288995 | A1 * | 11/2012 | El-Ghoroury | H01L 27/14618 438/107 |
| 2013/0175084 | A1 | 7/2013 | Taylor | |
| 2013/0270329 | A1 | 10/2013 | Schulte | |
| 2013/0341736 | A1 * | 12/2013 | Kohl | B81C 1/00333 257/415 |
| 2014/0042625 | A1 * | 2/2014 | Huang | H01L 23/48 257/751 |
| 2015/0243525 | A1 * | 8/2015 | Park | H01L 21/31144 438/703 |
| 2017/0179029 | A1 * | 6/2017 | Enquist | H01L 21/76838 |

OTHER PUBLICATIONS

Straessle, R., et al., "Evaluation of Thin Film Indium Bonding at Wafer Level," Procedia Engineering, vol. 25:1493-1496 (2011).

Welch, III, W.C., and K. Najafi, "Gold-Indium Transient Liquid Phase (TLP) Wafer Bonding for MEMS Vacuum Packaging," IEEE 21st International Conference on Micro Electro Mechanical Systems, MEMS 2008.

Search Report in corresponding European Application No. 18207750.3, dated Mar. 29, 2019.

* cited by examiner

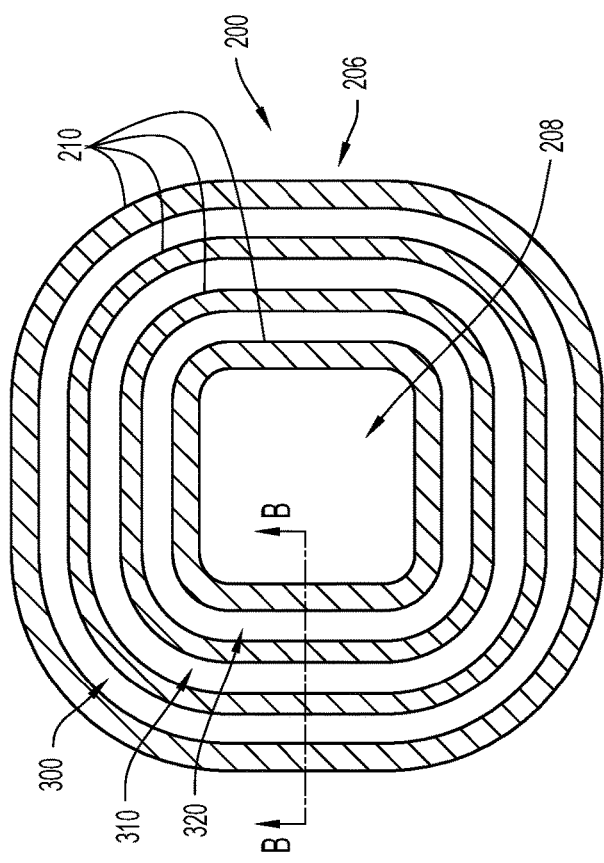
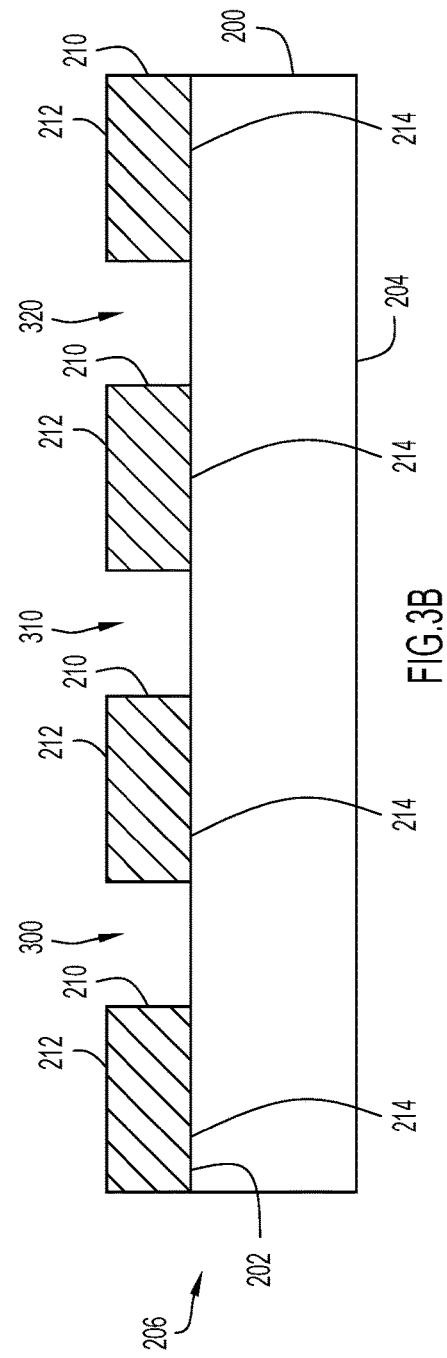
FIG.3A
FIG.3B

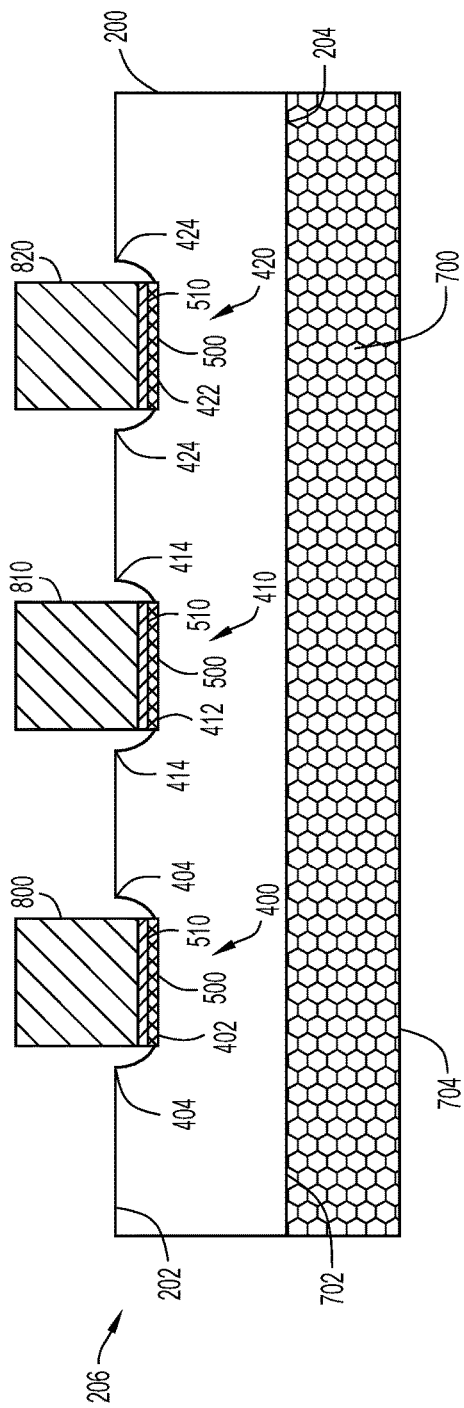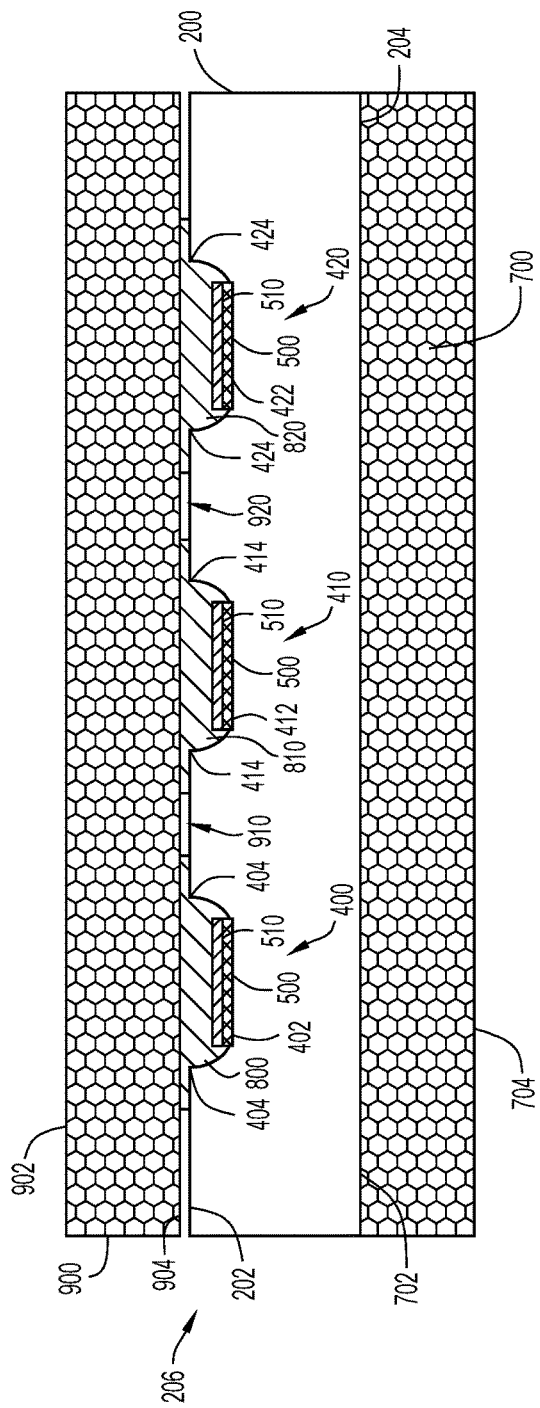

METHOD FOR FORMING HERMETIC SEALS IN MEMS DEVICES

FIELD OF THE INVENTION

The present invention relates to hermetically sealing microelectromechanical systems (MEMS). More specifically, the present invention relates to a method for low temperature bonding multiple wafers together in a MEMS device requiring a hermetically sealed cavity.

BACKGROUND

Image intensifier devices may be utilized in night vision goggles to amplify a low light scene to the user. Utilizing a MEMS image intensifier may enable the reduction of the size and weight of the night vision goggles. The MEMS image intensifier device may be constructed from a plurality of different wafers that are hermetically sealed to one another. In a conventional wafer construction process for a MEMS image intensifier device, a first wafer requires double sided processing, where a one of the sides of the first wafer may be required to utilize a low temperature hermetic seal to bond a second wafer to the first wafer. This low temperature hermetic seal often utilizes indium and one or more adhesion metals that underlies the indium. In conventional wafer construction processes, indium and adhesion metals are placed on a planar surface of the wafer substrate in order to achieve a low temperature hermetic seal. Indium is a very soft and tacky metal and can be easily damaged or stick to tooling. To avoid handling indium throughout the wafer production process the material is deposited late in the process onto adhesion metals on the wafer surface. Double sided wafers, however, are repeatedly handled and placed in and out semiconductor equipment (e.g., chucks, etc.) during the wafer construction process. This often results in the adhesion metals becoming scratched or damaged during the wafer construction process. Once the adhesion metals become damaged, a hermetic seal is prevented from forming due to gaps or scratches in the adhesion metals because the indium does not wet across the damaged area. Furthermore, once indium oxidizes, fresh indium must be exposed in order to provide the bonding and hermetic seal. Thus, as is often the case in conventional wafer constructions, a bonding surface of the second wafer must have protrusions in order to penetrate and expose the fresh indium disposed on the adhesion metals of the planar surface of the other wafer.

Therefore, what is needed is a process of low temperature combining/bonding of multiple wafers of a MEMS device that does not damage the adhesion metals allowing continuous patterns of Indium to form a proper hermetic seal between wafers. Furthermore, what is also needed is a process that enables double sided processing of bonded wafer pairs with low temperature bonding. What is also needed a process that hermetically seals the wafers together with a low temperature bond having a reduced seal area.

SUMMARY

A method of processing a double sided wafer of a microelectromechanical device includes spinning a resist onto a first side of a first wafer. The method further includes forming one or more pathways within the resist to expose portions of the first side of the first wafer. The one or more pathways may be formed as concentric patterns, be it circles, ovals or rounded rectangles. The method also includes etching one or more depressions in the first side of the first wafer through the one or more pathways, where each of the one or more depressions contain a planar surface and set of edges. Furthermore, the method includes depositing one or more adhesion metals over the resist such that the one or more adhesion metals are deposited within the one or more depressions, and then removing the resist from the first wafer. The method finally includes depositing indium onto the adhesion metals deposited within the depressions and then bonding a second wafer to the first wafer by compressing the indium between the second wafer and the first wafer.

In another embodiment, a microelectromechanical system includes a first wafer, one or more adhesive metals, one or more deposits of indium, and a second wafer. The first wafer includes a first side and a second side, the first side having a peripheral region that surrounds a central region. The first wafer further includes one or more depressions formed in the peripheral region of the first side of the first wafer. Each of the one or more depressions includes a set of edges. The one or more adhesive metals are disposed within the one or more depressions such that the one or more adhesive metals do not extend beyond the one or more depressions. The second wafer is bonded to the first side of the first wafer by compressing the indium that is disposed on the one or more adhesive metals. When compressed, the edges of each of the one or more depressions form shear points for the indium, enabling a low temperature bond.

BRIEF DESCRIPTION OF THE DRAWINGS

FIG. 3A illustrates a top view of the first wafer with pathways disposed in the resist in accordance with the method illustrated in FIG. 1.

FIG. 3B illustrates a cross-sectional view of the first wafer illustrated in FIG. 3A, the cross-sectional view taken along line B-B in FIG. 3A.

FIG. 8 illustrates a cross-sectional view of the first wafer illustrated in FIGS. 2A, 2B, 3A, and 3B, where indium is deposited on the first wafer in accordance with the method illustrated in FIG. 1.

FIG. 9 illustrates a cross-sectional view of the first wafer illustrated in FIGS. 2A, 2B, 3A, and 3B, where a third wafer is coupled to the top surface of the first wafer via the indium in accordance with the method illustrated in FIG. 1.

Like reference numerals have been used to identify like elements throughout this disclosure.

DETAILED DESCRIPTION

An exemplary method of wafer processing of a MEMS device utilized as image intensifiers of night vision goggles in accordance with the present invention are illustrated in FIGS. 1, 2A, 2B, 3A, 3B, and 4-9. The method 100 disclosed herein enables double sided wafer processing without damaging the adhesion metals to enable the formation of a low temperature hermetic seal with a reduced seal area.

Figure 1:
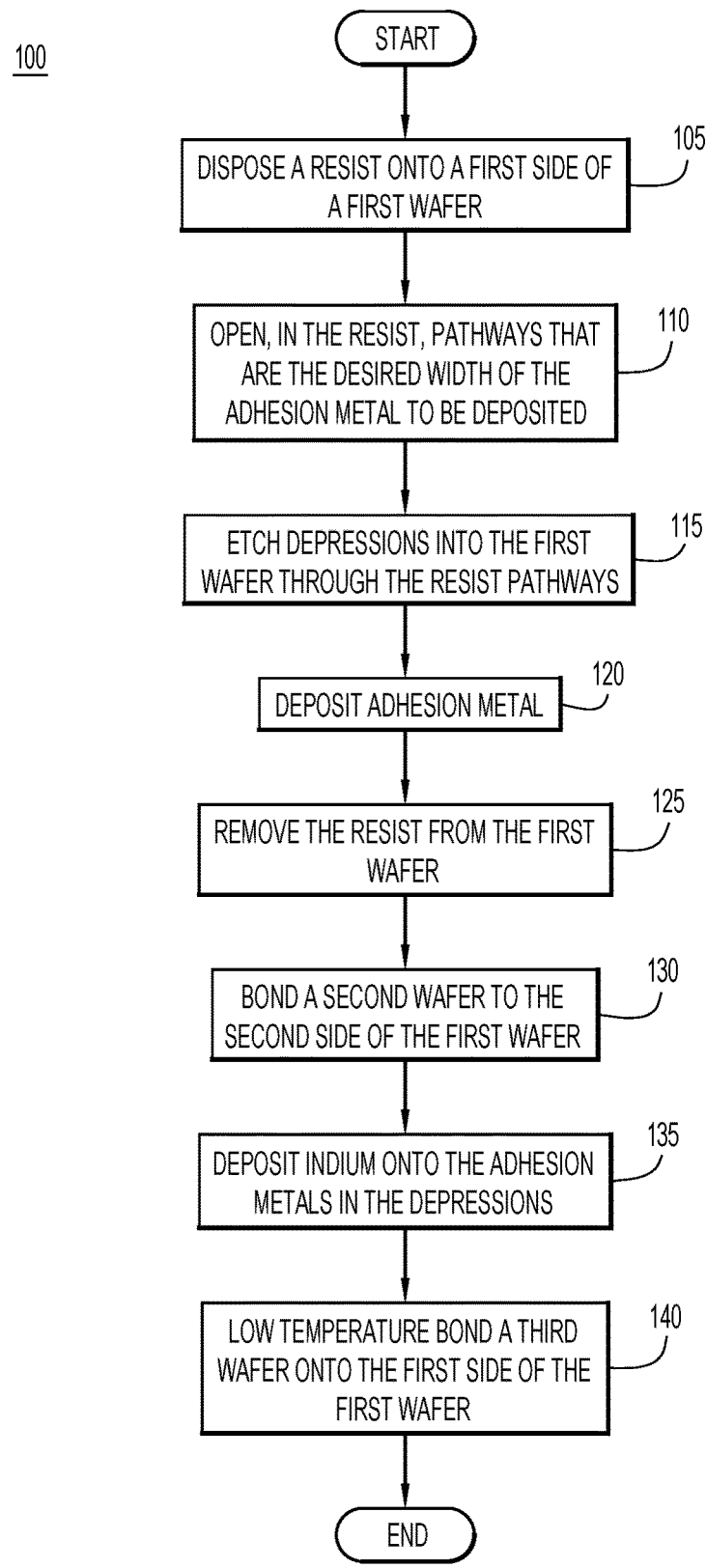
FIG. 1 illustrates a flowchart of a method for bonding multiple wafers together in accordance with the present invention.
Figure 2A:
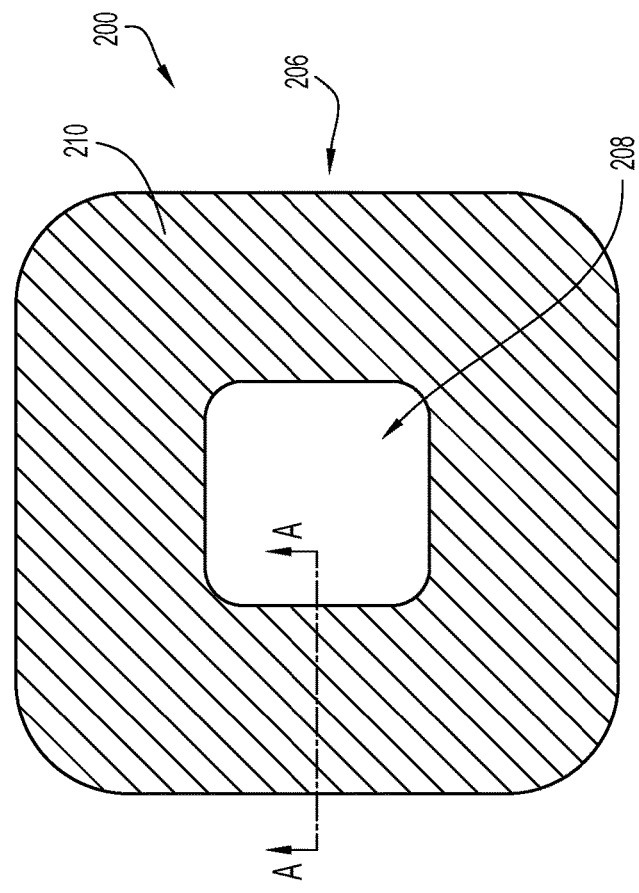
FIG. 2A illustrates a top view of a first wafer with a resist spun around a peripheral region of a top surface of the first wafer in accordance with the method illustrated in FIG. 1.
Figure 2B:
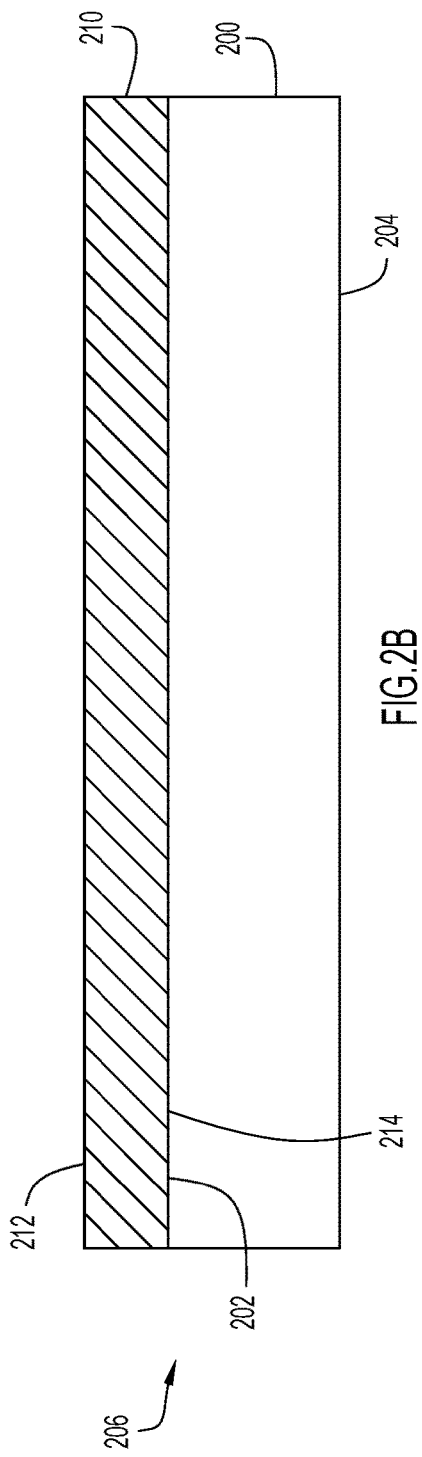
FIG. 2B illustrates a cross-sectional view of the first wafer illustrated in FIG. 2A, the cross-sectional view taken along line A-A in FIG. 2A.

As illustrated in FIG. 1, the first step 105 of method 100 is to dispose a resist onto a region of a first side of a first wafer. Illustrated in FIGS. 2A and 2B is a region of a first wafer 200 with a resist 210 being disposed or spun onto the first wafer 200 around the periphery of the region. The first wafer 200 may be any type of wafer, including, but not limited to, a glass wafer, a silicon wafer, etc. The first wafer 200 includes a first or top side 202 and a second or bottom side 204. As illustrated in FIG. 2A, the region of the first wafer 200 is substantially rectangular in shape, but the first wafer may be of any other shape, including but not limited to, circular, pentagonal, octagonal, etc.

The resist 210 may be a photoresist that is disposed on the surface of the first side 202 of the first wafer 200 by spin coating (e.g., a viscous, liquid solution of photoresist is dispensed onto the first wafer 200, and the first wafer 200 is spun rapidly to produce a uniformly thick layer). As best illustrated in FIG. 2A, the resist 210 may be disposed on the surface of the first side 202 of the first wafer 200 such that the resist 210 is disposed around the periphery of the region of first wafer 200 proximate to the edges 206 of the region of the first wafer 200. Moreover, the resist 210 leaves a central portion 208 of the first side 202 of the first wafer 200 exposed, which will later form a portion of a vacuum cavity when another wafer is bonded to the first wafer 200. The resist 210, when disposed on the surface of the first side 202 of the first wafer 200, may include a first or top side 212 and a second or bottom side 214. The second side 214 of the resist 210 is in abutment with the first side 202 of the first wafer 200. The proportions of the area of the first side 202 of the first wafer that is occupied by the resist 210 compared with the central portion 208, as illustrated in FIG. 2A, is for illustrative purposes only. Thus, the central portion 208 may occupy a larger area of the first wafer 200 than the resist 210.

Returning to FIG. 1, the second step 110 of method 100 is to remove portions of the resist 210 to open pathways through the resist 210, where the pathways are the desired width of adhesion metals to later be deposited. Illustrated in FIGS. 3A and 3B a series of pathways 300, 310, 320 are created in the resist 210 such that each of the pathways 300, 310, 320 extend through the resist 210 from the first surface 212 to the second surface 214 to expose previously covered portions of the surface of the first side 202 of the first wafer 200. Moreover, the pathways 300, 310, 320 are concentric to one another, and may also be concentric to the first wafer 200 and the central portion 208 of the first wafer 200. The first pathways 300 is the outermost pathway, the third pathways 320 is the innermost pathway, and the second pathways 310 is disposed between the first and third pathways 300, 320. Additionally, each of the pathways 300, 310, 320 extends continuously through the resist 210 around the periphery of the region of the first wafer 200.

The pathways 300, 310, 320 may be formed in the resist 210 by exposing the resist 210 to a pattern of light that chemically changes the resist 220 and the enables the exposed portion of the resist 210 to be removed by a special solution. In some embodiments, depending on the type of resist 210 used, the resulting wafer may be baked to solidify the remaining resist 210. Furthermore, any number of pathways 300, 310, 320 may be formed within the resist 210, while these pathways 300, 310, 320 may be of any width.

Figure 4:
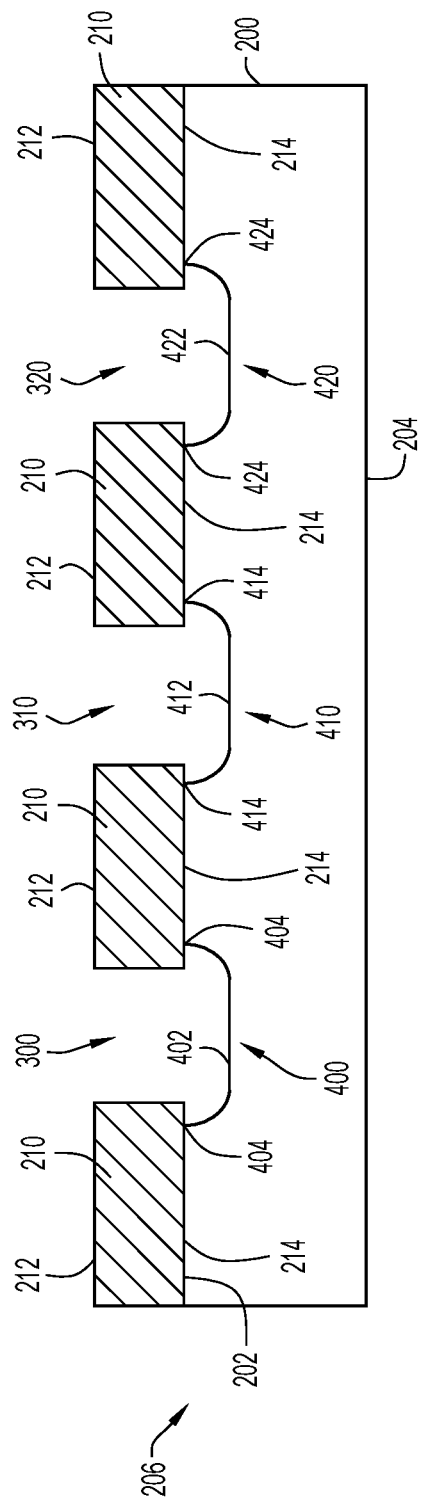
FIG. 4 illustrates a cross-sectional view of the first wafer illustrated in FIGS. 2A, 2B, 3A, and 3B, where depressions are etched into the top surface of the first wafer through the pathways in accordance with the method illustrated in FIG. 1.

Turning back to FIG. 1, the third step 115 of method 100 is to etch depressions into the surface of the first side 202 of the first wafer 200 through the pathways 300, 310, 320 of the resist 210 to form recessed cavities or depressions in the surface of the first side 202 of the first wafer 200. As illustrated in FIG. 4, a series of depressions 400, 410, 420 are formed in the surface of the first side 202 of the first wafer 200 such that each of the depressions 400, 410, 420 are aligned with the pathways 300, 310, 320. More specifically, the first depression 400 is aligned with the first pathways 300, the second depression 410 is aligned with the second pathway 310, and the third depression 420 is aligned with the third pathway 320. Similar to the pathways 300, 310, 320, the depressions 400, 410, 420 are concentric to one another, and are also concentric to the first wafer 200 and the central portion 208 of the first wafer 200. Thus, the first depression 400 is the outermost depression, the third depression 420 is the innermost depression, and the second depression 410 is disposed between the first and third depression 400, 420. Additionally, each of the depressions 400, 410, 420 extends continuously around the periphery of the region of the first side 202 of the first wafer 200 such that the depressions 400, 410, 420 are concentric to the central portion 208 of the first wafer 200.

As further illustrated in FIG. 4, each of the depressions 400, 410, 420 may be formed to contain a planar portion 402, 412, 422, respectively. Furthermore, the depressions 400, 410, 420 together form edges 404, 414, 424, respectively, with the surface of the first side 202 of the first wafer 200. In some embodiments, the depressions 400, 410, 420 may be etched into the surface of the first side 202 of the first wafer 200 such that each depression 400, 410, 420 contains a plurality of stepped edges 404, 414, 424 between the surface of the first side 202 of the first wafer 200 and the planar portion 402, 412, 422, respectively. As illustrated in FIG. 4, the depressions 400, 410, 420 are etched into the first side 202 of the first wafer 200 such that the edges 404, 414, 424 of the depressions 400, 410, 420, respectively, are disposed under the remaining portions of the resist 210 (i.e., the depressions are over etched such that the edges 404, 414, 424 are disposed outside of the pathways 300, 310, 320, respectively). In other words, the depressions 400, 410, 420 are etched into the first side 202 of the first wafer 200 such that the depressions 400, 410, 420 undercut the resist 210.

The surface of the first side 202 of the first wafer 200 may be etched through the pathways 300, 310, 320 to form the depressions 400, 410, 420. In one embodiment, the etching may be completed through liquid or "wet" etching (i.e., isotropic etching). In another embodiment, the etching may be completed through plasma or "dry" etching. As illustrated in FIG. 4, the etching may result in undercutting the pathways 300, 310, 320 formed in the resist 210.

Returning to FIG. 1, the fourth step 120 of method 100 is to deposit adhesion metals to the first side 202 of the first wafer 200 outside of the central region 208. Thus, the adhesion metals are deposited over the resist 210, the pathways 300, 310, 320, and the depressions 400, 410, 420. In other words, the adhesion metals are not disposed in the central region 208 of the first wafer 200. In the embodiment illustrated in FIG. 5, two adhesion metals 500, 510 are deposited. Moreover, because of the pathways 300, 310, 320, once deposited, the adhesion metals 500, 510 are disposed on both the resist 210 and within the depressions 400, 410, 420.

Figure 5:
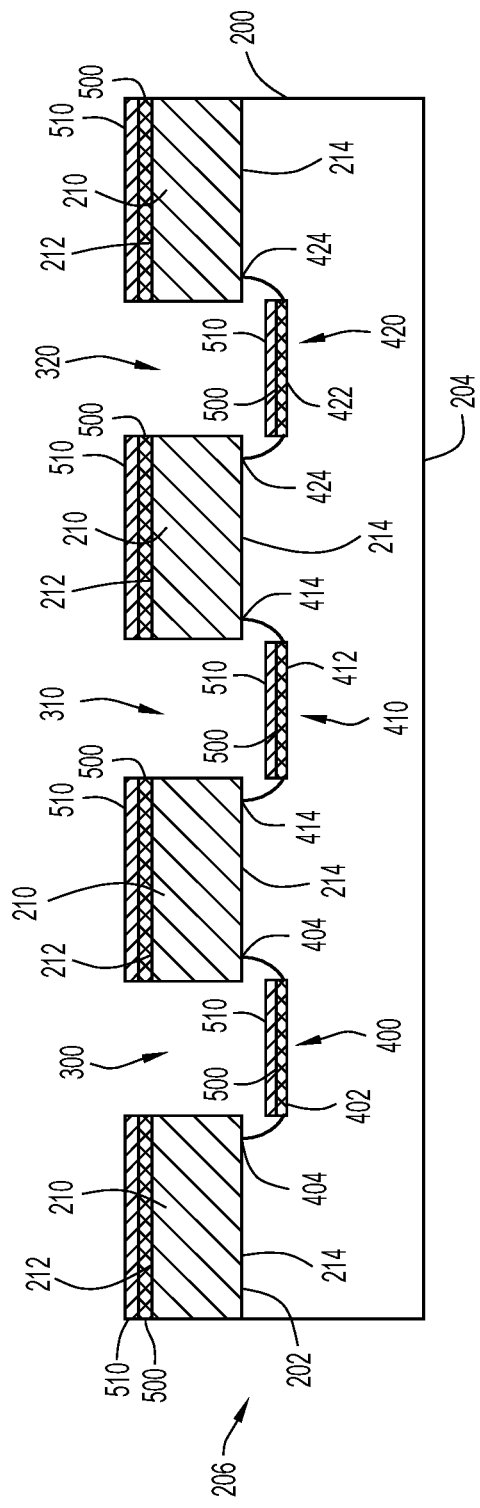
FIG. 5 illustrates a cross-sectional view of the first wafer illustrated in FIGS. 2A, 2B, 3A, and 3B, where adhesion metals are deposited onto the first wafer in accordance with the method illustrated in FIG. 1.

As further illustrated in FIG. 5, the first adhesion metal 500 was first deposited such that the first adhesion metal 500 sits or rests on the first side 212 of the resist 210 and sits or rests directly on the planar surfaces 402, 412, 422 of the depressions 400, 410, 420, respectively. The second adhesion metal 510 is then deposited atop the first adhesion metal 500 such that the second adhesion metal 510 sits or rests on the deposits of the first adhesion metal 500 disposed on the resist 210 and the deposits of the first adhesion metal 500 disposed within the depressions 400, 410, 420. The first and second adhesion metals 500, 510 may be deposited along the entire planar surface 402, 412, 422 of the depressions 400, 410, 420, respectively. Moreover, the depressions 400, 410, 420 are of a depth that, when deposited within the depressions 400, 410, 420, the deposits of the adhesion metals 500, 510 do not extend beyond the top side 202 of the first wafer 200. As illustrated, the resist 210 not only can be used to enable the formation of the depressions 400, 410, 420, but also prevents the adhesion metals 500, 510 from being deposited on the surface of the first side 202 of the first wafer 200 outside of the depressions 400, 410, 420.

As previously explained, in the embodiment illustrated in FIG. 5, two adhesion metals are deposited onto the first wafer 200. In other embodiments, any number of adhesion metals may be deposited. Furthermore, any type of adhesion metal may be deposited, including, but not limited to, chromium, gold, nickel, titanium, etc. In the embodiment illustrated, the first adhesion metal 500 may be titanium and the second adhesion metal 510 may be gold.

Figure 6:
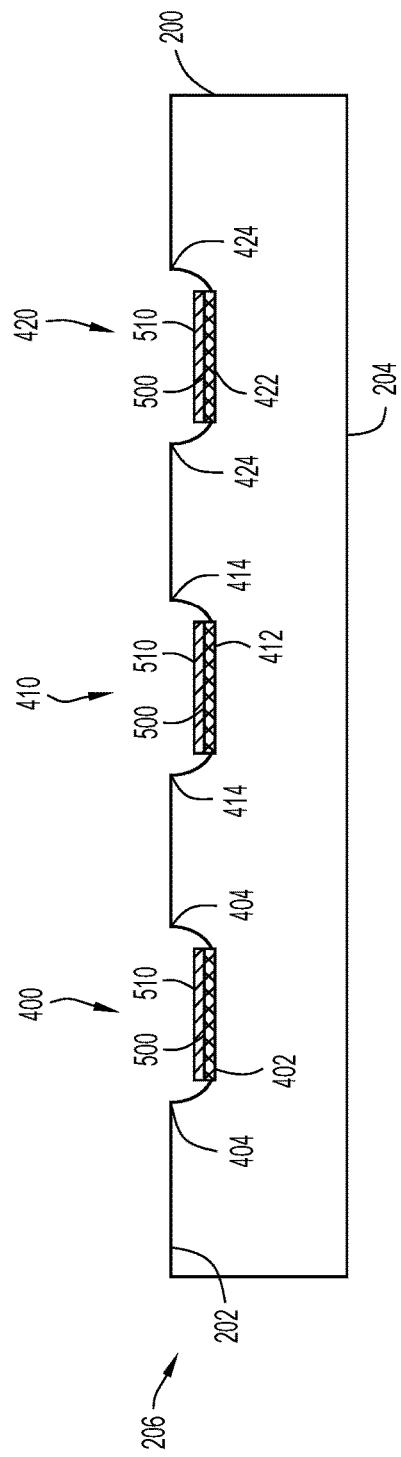
FIG. 6 illustrates a cross-sectional view of the first wafer illustrated in FIGS. 2A, 2B, 3A, and 3B, where the resist is removed from the first wafer in accordance with the method illustrated in FIG. 1.

Returning to FIG. 1, the fifth step 125 of method 100 is to remove the resist 210 from the first side 202 of the first wafer 200. As illustrated in FIG. 6, when the resist 210 is removed, the deposits of the adhesion metals 500, 510 that were disposed on the first side 212 of the resist 210 are also removed. Thus, portions of the first side 202 of the first wafer 200 that were previously covered by the resist 210 are exposed. Furthermore, the only deposits of the adhesion metals 500, 510 that remain disposed on the first wafer 200 are the deposits of the adhesion metals 500, 510 that are disposed within the depressions 400, 410, 420 on the planar surface 402, 412, 422, respectively. As previously explained, the resist 210 both enables the formation of the depressions 400, 410, 420 and prevents the adhesion metals 500, 510 from being deposited on the surface of the first side 202 of the first wafer 200 outside of the depressions 400, 410, 420.

Figure 7:
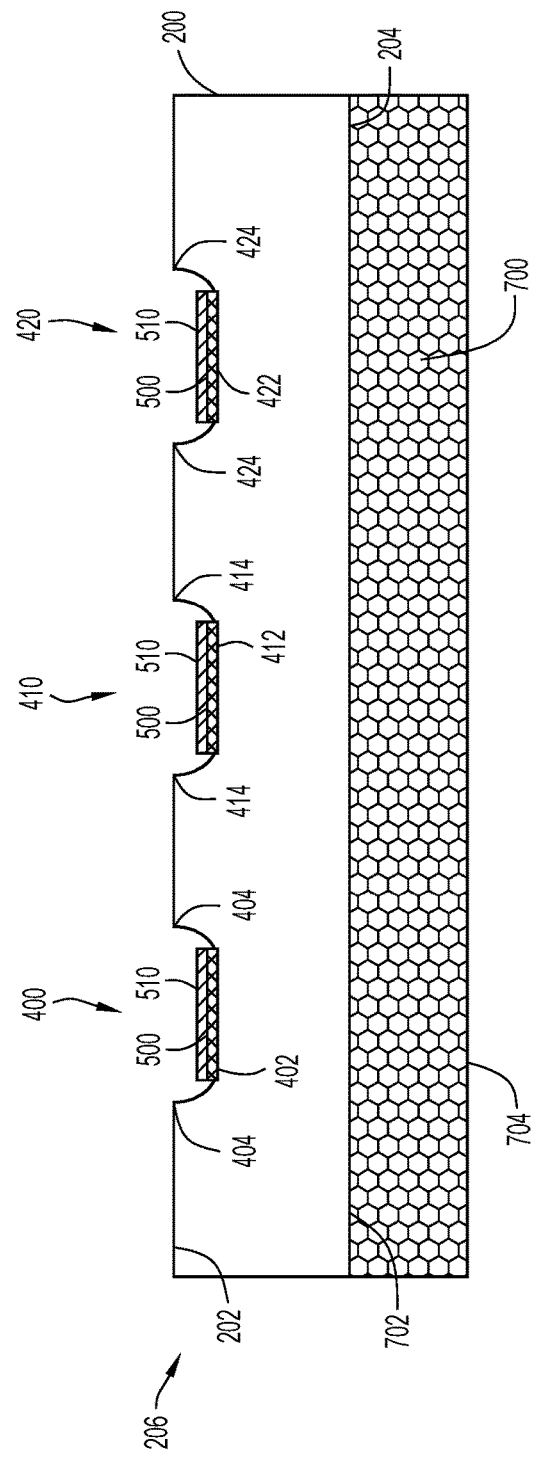
FIG. 7 illustrates a cross-sectional view of the first wafer illustrated in FIGS. 2A, 2B, 3A, and 3B, where a second wafer is coupled to the bottom of the first wafer in accordance with the method illustrated in FIG. 1.

The sixth step 130 of method 100, as illustrated in FIG. 1, is to bond a second wafer onto the second side 204 of the first wafer 200. As illustrated in FIG. 7, a second wafer 700 is bonded to the second side 204 of the first wafer 200. The second wafer 700 may be any type of wafer, include, but not limited to, silicon, glass, etc. In the embodiment illustrated in FIG. 7, however, the second wafer 700 is a silicon wafer. The second wafer 700 may include a first side 702 and a second side 704. The surface of the first side 702 of the second wafer 700, as illustrated, is bonded, either directly or indirectly, to the surface of the second side 204 of the first wafer 200. The bonding of the second wafer 700 to the first wafer 200 may be any type of high temperature bond, which requires force to be applied to the first side 202 of the first wafer 200 and the second side 704 of the second wafer 700 during the bonding process. Thus, a tool is required to contact and apply force to the first side 202 of the first wafer 200 while simultaneously contacting and applying force to the second side 704 of the second wafer 700. Because the adhesion metals 500, 510 are disposed within the depressions 400, 410, 420, when a tool applies the bonding force to the first side 202 of the first wafer 200, and because the adhesion metals 500, 510 do not extend beyond the first side 202 of the first wafer 200, the adhesion metals 500, 510 are not contacted by the tool during the high temperature bonding of the second wafer 700 to the first wafer 200. Accordingly, application of the tool to the first side 202 of the first wafer 200 does not damage the adhesion metals 500, 510 during the high temperature bonding process.

Turning back to FIG. 1, the seventh step 135 of method 100 is to deposit indium onto the adhesion metals 500, 510 disposed within the depressions 400, 410, 420. As illustrated in FIG. 8, when the indium 800, 810, 820 is disposed on the adhesion metals 500, 510 in the depression 400, 410, 420, respectively, the deposited indium 800, 810, 820 is taller than it is wider. This enables the deposited indium 800, 810, 820 to extend out of the depressions 400, 410, 420, respectively, and beyond the first side 202 of the first wafer 200. Moreover, each of the indium deposits 800, 810, 820, in the state illustrated in FIG. 8, are spaced from the edges 404, 414, 424 of depressions 400, 410, 420, respectively. The deposited indium 800, 810, 820 is deposited throughout the depressions 400, 410, 420, respectively, such that the deposited indium 800, 810, 820 forms concentric rectangles around the periphery of the region of the first side 202 of the first wafer 200 like that of the depressions 400, 410, 420. Similar to the depressions 400, 410, 420, the deposited indium 800, 810, 820 may also be concentric to the first wafer 200 and the central portion 208 of the first wafer 200. Thus, the first indium deposit 800 is the outermost indium deposit, the third indium deposit 820 is the innermost indium deposit, and the second indium deposit 810 is disposed between the first and third indium deposits 800, 820. Furthermore, each of the indium deposits 800, 810, 820 extend continuously through the depressions 400, 410, 420, respectively.

The indium 800, 810, 820 may be deposited within the depressions 400, 410, 420, and onto the adhesive metals 500, 510 in a plurality of ways. In one embodiment, the indium 800, 810, 820 may be preformed onto a substrate such as paper. The paper with the preformed indium 800, 810, 820 is then placed over the depressions 400, 410, 420, respectively, such that the preformed indium 800, 810, 820 is disposed within their respective depression 400, 410, 420. The indium 800, 810, 820 is then release from the paper and the paper is then removed, leaving the indium 800, 810, 820 atop the adhesion metals 500, 510 within the depressions 400, 410, 420 as illustrated in FIG. 8. In another embodiment, the indium 800, 810, 820 may be three dimensionally printed by a three dimensional printer into the depressions 400, 410, 420, respectively, such that the indium 800, 810, 820 sits atop the adhesion metals 500, 510 as illustrated in FIG. 8. In yet another embodiment, the indium 800, 810, 820 may be deposited into the depression 400, 410, 420, respectively, using a lithography process similar to that described above for forming the depression 400, 410, 420 and depositing the adhesion metals 500, 510. Regardless of the method of depositing the indium 800, 810, 820 into the depressions 400, 410, 420, respectively, the deposited indium 800, 810, 820 may be oxidized when exposed to atmosphere after removal from the deposition tool.

Returning to FIG. 1, once the indium 800, 810, 820 is deposited, the eighth and final step 140 of method 100 may be performed, which is to form a low temperature bond between a third wafer and the first side 202 of the first wafer 200. As illustrated in FIG. 9, the third wafer 900 may be any type of wafer, including, but not limited to, silicon, glass, etc. Furthermore, in the embodiment illustrated in FIG. 9, the third wafer 900 is a silicon wafer like that of the second wafer 700. The third wafer 900 may include a first side 902 and a second side 904. During the low temperature bonding process, the third wafer 900 is pressed against the first wafer 200 such that the second side 904 of the third wafer 900 is propelled or urged toward the first side 202 of the first wafer 200. As the third wafer 900 is propelled toward the first wafer 200, the second side 904 of the third wafer 900 comes into contact with the deposited indium 800, 810, 820. The force used to propel the third wafer 900 toward the first wafer 200 causes the indium 800, 810, 820 to be compressed between the first wafer 200 and the third wafer 900. As illustrated in FIG. 9, because of the shape of the indium deposits 800, 810, 820 (i.e., because the indium deposits 800, 810, 820 are taller than they are wider), as the indium deposits 800, 810, 820 are compressed, the indium 800, 810, 820 spreads throughout their respective depressions 400, 410, 420, over the respective edges 404, 414, 424 of the depressions 400, 410, 420, and at least partially along the surface of the first side 202 of the first wafer 200. As further illustrated in FIG. 9, the indium deposits 800, 810, 820 are sized and shaped such that, when compressed, gaps 910, 920 are formed (i.e., the compressed indium deposits 800, 810, 820 do not run together when compressed). The edges 404, 414, 424 of the depressions 400, 410, 420 provide shear points for the compressed indium 800, 810, 820 and expose non-oxidized indium that form the contact points to form a low temperature bond between the third wafer 900 and the first wafer 200. When the depressions 400, 410, 420 are formed with more edges 404, 414, 424 (i.e., the plurality of stepped edge structure described above), more shear points are provided to expose the non-oxidized portions of the indium deposits 800, 810, 820 when compressed, thus forming a stronger low temperature bond between the wafers 200, 900.

The method and structure described and illustrated provides a self-aligned method of making depressions and lithography mask for depositing adhesion metals onto a wafer such that the wafer can be processed without damaging the adhesion metals. This enables a first wafer to form a better and more guaranteed hermetic seal with a second wafer when using low temperature bonding processes. The described method also provides a structure that may cause multiple shear points in the flowing indium in order to provide a maximum bond surface for hermeticity. Multiple shear points may lead to the reduction in the number of bond lines (i.e., depressions), which thereby reduce the overall seal line width enabling more die per wafer.

It is to be understood that terms such as "left," "right," "top," "bottom," "front," "rear," "side," "height," "length," "width," "upper," "lower," "interior," "exterior," "inner," "outer" and the like as may be used herein, merely describe points or portions of reference and do not limit the present invention to any particular orientation or configuration. Further, the term "exemplary" is used herein to describe an example or illustration. Any embodiment described herein as exemplary is not to be construed as a preferred or advantageous embodiment, but rather as one example or illustration of a possible embodiment of the invention.

Although the disclosed inventions are illustrated and described herein as embodied in one or more specific examples, it is nevertheless not intended to be limited to the details shown, since various modifications and structural changes may be made therein without departing from the scope of the inventions and within the scope and range of equivalents of the claims. In addition, various features from one of the embodiments may be incorporated into another of the embodiments. Accordingly, it is appropriate that the appended claims be construed broadly and in a manner consistent with the scope of the disclosure as set forth in the following claims.

What is claimed:

1. A method for forming a low temperature bond between wafers, the method comprising:
   spinning a resist onto a first side of a first wafer;
   forming one or more pathways within the resist to expose portions of the first side of the first wafer;
   etching the first side of the first wafer through the one or more pathways to form one or more depressions that align with the pathways, each of the one or more depressions having a planar surface and edges;
   depositing one or more adhesion metals over the resist such that the one or more adhesion metals is deposited within each of the one or more depressions;
   removing the resist;
   depositing indium onto the one or more adhesion metals deposited within the one or more depressions such that the indium is spaced from the edges of the one or more depressions; and
   compressing the indium between a second wafer and the first side of the first wafer to form a bond between the second wafer and the first wafer.

2. The method of claim 1, wherein the one or more depressions are concentric to the first wafer.

3. The method of claim 1, wherein each of the one or more depressions extend continuously around a peripheral region of the first side of the first wafer.

4. The method of claim 1, wherein the one or more adhesion metals comprise:
   a first adhesion metal of titanium; and
   a second adhesion metal of gold.

5. The method of claim 1, wherein the edges of the one or more depressions form shear points for the indium when the indium is compressed.

6. The method of claim 1, further comprising, prior to depositing the indium:
   bonding a third wafer to a second surface of the first wafer.

7. The method of claim 6, wherein the bond between the second wafer and the first side of the first wafer is a hermetic bond, and the bonding of the third wafer with the first wafer is formed by using an applied force to the first wafer and the third wafer.

8. The method of claim 6, wherein the second and third wafers are silicon wafers.

9. The method of claim 1, wherein the first wafer is a glass wafer.

10. The method of claim 1, wherein the one or more depressions are etched into the first side of the first wafer via isotropic etching.

11. A method for forming a low temperature bond between wafers, the method comprising:
    spinning a resist onto a peripheral region of a first side of a first wafer;
    forming one or more pathways into the resist;
    etching one or more depressions into the first side of the first wafer through the one or more pathways, each of the one or more depressions having edges;

depositing one or more adhesion metals into the one or more depressions;

bonding a second wafer to a second side of the first wafer by using an applied force to the first wafer and the second wafer;

depositing indium within the depressions and onto the adhesion metals deposited within the one or more depressions such that the indium extends out from the one or more depressions and is spaced from the edges of the one or more depressions; and bonding a third wafer to the first side of the first wafer by compressing the indium between the third wafer and the first side of the first wafer.

12. The method of claim 11, wherein each of the one or more depressions have a first depth, the adhesive metals have a first height, and the first depth is greater than the first height.

13. The method of claim 11, wherein the third wafer is bonded to the first wafer via a hermetic bond.

14. The method of claim 13, wherein the second and third wafers are silicon wafers, and the first wafer is a glass wafer.

15. The method of claim 11, wherein the one or more depressions extend continuously around the peripheral region of the first wafer.

16. The method of claim 11, wherein the peripheral region of the first side of the first wafer surrounds a central region of the first side of the first wafer.

17. The method of claim 16, wherein the one or more depressions are disposed within the peripheral region.

18. The method of claim 17, wherein the one or more depressions extend continuously around the peripheral region of the first wafer.

19. The method of claim 17, wherein compression of the indium between the first wafer and the third wafer causes the edges of the one or more depressions to form shear points for the indium.

20. The method of claim 11, wherein the one or more depressions are concentric to the first wafer.

* * * * *